United States Patent
Lee et al.

(10) Patent No.: US 11,621,452 B2
(45) Date of Patent: Apr. 4, 2023

(54) BATTERY PACK INCLUDING BATTERY MODULE

(71) Applicant: LG CHEM, LTD., Seoul (KR)

(72) Inventors: Kwang-Bae Lee, Daejeon (KR);
Kun-Joo Yang, Daejeon (KR);
Seog-Jin Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 267 days.

(21) Appl. No.: 16/961,046

(22) PCT Filed: Nov. 12, 2019

(86) PCT No.: PCT/KR2019/095044
§ 371 (c)(1),
(2) Date: Jul. 9, 2020

(87) PCT Pub. No.: WO2020/111918
PCT Pub. Date: Jun. 4, 2020

(65) Prior Publication Data
US 2020/0388804 A1 Dec. 10, 2020

(30) Foreign Application Priority Data
Nov. 29, 2018 (KR) .................. 10-2018-0151274

(51) Int. Cl.
*H01M 50/20* (2021.01)
*H01M 50/213* (2021.01)
*H01M 50/242* (2021.01)

(52) U.S. Cl.
CPC ......... *H01M 50/20* (2021.01); *H01M 50/213* (2021.01); *H01M 50/242* (2021.01)

(58) Field of Classification Search
CPC ... H01M 50/20; H01M 50/213; H01M 50/242
See application file for complete search history.

(56) References Cited

U.S. PATENT DOCUMENTS

| 8,785,027 B2 | 7/2014 | Soong et al. |
| 9,153,799 B2 | 10/2015 | Kim et al. |

(Continued)

FOREIGN PATENT DOCUMENTS

| EP | 2 413 396 A2 | 2/2012 |
| EP | 3018729 A1 | 5/2016 |

(Continued)

OTHER PUBLICATIONS

Extended European Search Report for European Application No. 19891139.8, dated May 10, 2021.

(Continued)

*Primary Examiner* — Jonathan G Jelsma
(74) *Attorney, Agent, or Firm* — Birch, Stewart, Kolasch & Birch, LLP

(57) ABSTRACT

Discussed is a battery pack having a mounting structure including: a frame having a body portion with a plate placed horizontally, and sidewalk bent from opposite ends of the body portion and extending upward to form an inner space above the plate, and a battery module accommodated in the inner space of the frame, and including: a plurality of cylindrical battery cells; a module case having a plurality of hollow tubes into which the plurality of cylindrical battery cells standing upright in an upper and lower direction are inserted; and a connection portion configured to connect the plurality of hollow tubes to each other.

13 Claims, 12 Drawing Sheets

(56) References Cited

U.S. PATENT DOCUMENTS

| | | |
|---|---|---|
| 2002/0015880 A1 | 2/2002 | Heimer |
| 2008/0305388 A1 | 12/2008 | Haussman |
| 2012/0258335 A1 | 10/2012 | Bae |
| 2013/0136969 A1 | 5/2013 | Yasui et al. |
| 2013/0344376 A1 | 12/2013 | Asaida et al. |
| 2016/0006006 A1 | 1/2016 | Motokawa et al. |
| 2017/0025654 A1 | 1/2017 | Oh et al. |
| 2017/0110753 A1 | 4/2017 | Ko et al. |
| 2017/0229689 A1* | 8/2017 | Fujiwara ............. H01M 50/213 |
| 2019/0288253 A1* | 9/2019 | Matsushita ........... H01M 50/20 |
| 2019/0393461 A1* | 12/2019 | Pare ..................... E21B 47/017 |

FOREIGN PATENT DOCUMENTS

| | | |
|---|---|---|
| EP | 3 531 500 A1 | 8/2019 |
| JP | 2005-317458 A | 11/2005 |
| JP | 2009-218011 A | 9/2009 |
| KR | 10-2013-0025390 A | 3/2013 |
| KR | 10-1256075 B1 | 4/2013 |
| KR | 10-1446147 B1 | 10/2014 |
| KR | 10-2017-0010693 A | 2/2017 |
| KR | 10-1816355 B1 | 1/2018 |
| KR | 10-2018-0117033 A | 10/2018 |
| WO | WO 2010/109001 A1 | 9/2010 |
| WO | WO 2015/105335 A1 | 7/2015 |

OTHER PUBLICATIONS

International Search Report (PCT/ISA/210) issued in PCT/KR2019/095044 dated Mar. 2, 2020.

\* cited by examiner

[BEFORE CRASH TEST]

[AFTER CRASH TEST]

BATTERY PACK INCLUDING BATTERY MODULE

TECHNICAL FIELD

The present disclosure relates to a battery pack including a battery module, and more particularly, to a battery pack having improved manufacturing efficiency, high energy density and enhanced product stability.

The present application claims priority to Korean Patent Application No. 10-2018-0151274 filed on Nov. 29, 2018 in the Republic of Korea, the disclosures of which are incorporated herein by reference.

BACKGROUND ART

A secondary battery is highly applicable to various products and has electrical characteristics with high energy density. The secondary battery is applied not only to portable electronic devices but also to electric vehicles, hybrid electric vehicles, power storage devices, and the like, driven by an electric driving source.

The secondary battery is attracting attention as a new energy source for improving eco-friendliness and energy efficiency since the use of fossil fuels is significantly reduced and no by-product is generated during the use of energy.

A battery pack applied to an electric vehicle has a structure in which a plurality of battery modules, each having a plurality of battery cells, are connected to obtain a high output. In addition, each battery cell is an electrode assembly including positive and negative electrode current collectors, a separator, an active material, an electrolyte, and the like, and may be repeatedly charged and discharged by an electrochemical reaction between the components.

Recently, as the need for a large-capacity structure is increased along with the utilization as an energy storage source, the demand for a battery pack having a multi-module structure in which a plurality of battery modules, in each of which a plurality of secondary batteries are connected in series and/or in parallel, are aggregated is increased. At this time, the battery pack may be configured such that the plurality of battery modules are closely arranged in a front and rear direction in order to accommodate a large number of battery modules in a limited space.

In addition, when the conventional battery pack is mounted to a vehicle, a bicycle, or the like, it is necessary to prevent the mounted battery pack from being damaged, exploded or fired due to an external impact caused by to an accident.

To this end, the conventional battery pack has been attempted to make the module case using a material with a higher mechanical rigidity or to provide a protection member for protecting a large number of cylindrical battery cells from an external impact. However, the change of material or the addition of a protective member has a problem of increasing the weight of the battery pack or increasing the manufacturing cost. Moreover, these attempts have a problem of lowering the energy density of the battery pack.

DISCLOSURE

Technical Problem

The present disclosure is designed to solve the problems of the related art, and therefore the present disclosure is directed to providing a battery pack having improved manufacturing efficiency, high energy density and enhanced product stability.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery pack, comprising:

a mounting structure including a first frame having a body portion with a plate of a lying-down form and sidewalls bent from both ends of the body portion and extending upward to form an inner space above the plate, and a second frame coupled to a lower portion of the first frame and having a body portion with a plate of a lying-down form and sidewalls bent from both ends of the body portion and extending downward to form an inner space below the plate; and at least two battery modules respectively accommodated in the inner spaces of the first frame and the second frame and including a plurality of cylindrical battery cells and a module case having a plurality of hollow tubes into which the plurality of cylindrical battery cells standing upright in an upper and lower direction are inserted and a connection portion configured to connect the plurality of hollow tubes to each other.

Also, the plurality of cylindrical battery cells may be arranged in a plurality of columns and rows, and the plurality of cylindrical battery cells may be arranged in a zigzag form along with cylindrical battery cells located in another adjacent row.

Moreover, the connection portion may extend in a diagonal direction to connect one hollow tube to another hollow tube located in another row.

In addition, the connection portion may have a plate shape of which one end is connected to one hollow tube and the other end is connected to another hollow tube.

Further, a vulnerable part may be formed at the connection portion so as to be ruptured or deformed by an external impact of the battery module.

Also, the module case may include an upper case having a plurality of upper hollow tubes configured to accommodate an upper portion of the plurality of standing cylindrical battery cells, and a lower case spaced apart from the upper case in a lower direction and having a plurality of lower hollow tubes configured to accommodate a lower portion of the plurality of standing cylindrical battery cells.

Moreover, a plurality of upper stoppers configured to block the at least one cylindrical battery cell in a lower direction may be formed at a top end of the upper case, and a plurality of lower stoppers configured to block the at least one cylindrical battery cell in an upper direction may be formed at a bottom end of the lower case.

In addition, the module case may include an outer wall opened in an upper and lower direction and connected to hollow tubes located at an outer side among the plurality of hollow tubes to surround the plurality of cylindrical battery cells in a horizontal direction.

Also, at least one of the plurality of upper stoppers and lower stoppers may extend to connect from an outer wall located at one side to an outer wall located at the other side.

Moreover, the outer wall provided in the extending direction of the upper stopper or the lower stopper may be located to face the sidewall of the first frame or the second frame.

In addition, a beading structure ridged inward or outward may be formed at the sidewall and the body portion of each of the first frame and the second frame.

Further, a fixing groove recessed inward may be formed in at least one of a top surface and a bottom surface of the module case.

Also, an insert portion protrusively extending outward may be formed on the body portion of each of the first frame and the second frame so as to be inserted into the fixing groove.

Further, the battery pack may further comprise:

an upper plate located to cover an upper portion of the first frame;

a lower plate located to support a lower portion of the second frame upward; and a pack housing having a top end coupled to the upper plate and a bottom end coupled to the lower plate and opened in an upper and lower direction.

In addition, a fixing portion protrusively extending inward may be formed at the upper plate and the lower plate so as to be inserted into the fixing groove of the module case.

Further, in another aspect of the present disclosure, there is also provided an electronic device, comprising the battery pack according to the present disclosure.

Also, in another aspect of the present disclosure, there is also provided a vehicle, comprising the battery pack according to the present disclosure.

Advantageous Effects

According to an embodiment of the present disclosure, since the battery pack of the present disclosure includes the mounting structure including the first frame and the second frame that respectively form an inner space to accommodate the battery module, it is possible to prevent the mounted battery module from being damaged, disabled, life-shortened, fired, or the like due to an external impact.

Also, according to an embodiment of the present disclosure, since the connection portion of the module case is configured to extend in a diagonal direction to connect one hollow tube and another hollow tube located in another row, when an external impact is applied to the battery module, the impact force is concentrated on the connection portion so that the connection portion is deformed or ruptured first, thereby minimizing the transmission of impact to the plurality of cylindrical battery cells accommodated in the module case.

Moreover, according to an embodiment of the present disclosure, since the vulnerable part is formed at the connection portion of the module case, the force of an external impact applied to the battery module is not concentrated on the cylindrical battery cells but the connection portion of the module case is destroyed first to absorb the impact force, thereby preventing the battery cells from being damaged, life-shortened, ignited, or the like due to the external impact.

In addition, according to an embodiment of the present disclosure, in the module case, since the hollow tubes are not formed to surround the entire outer surface of the plurality of cylindrical battery cells but the upper case and the lower case are provided to respectively surround only the upper surface and the lower surface of the plurality of cylindrical battery cells, the heat generated from the plurality of cylindrical battery cells may be effectively dissipated to the outside.

Further, according to an embodiment of the present disclosure, since the upper stopper and the lower stopper are formed at the upper case and the lower case, respectively, it is possible to effectively prevent the plurality of cylindrical battery cells accommodated inside the module case from escaping out of the module case or moving frequently due to an external impact. Accordingly, it is possible to prevent a contact failure or damage between the electrode terminals of the plurality of cylindrical battery cells and the connection plate electrically connected thereto.

Also, according to an embodiment of the present disclosure, since at least one of the plurality of upper stoppers and lower stoppers extends to connect from the outer wall at one side to the outer wall at the other side, the module case may have be advantageously configured to have mechanical stiffness so as to withstand an external impact applied in the left and right direction or in the front and rear direction.

In addition, according to an embodiment of the present disclosure, since the beading structures are formed at the sidewalls and the body portions of the first frame and the second frame, the mechanical stiffness of the mounting structure may be directly improved. Further, if the battery module accommodated in the inner space moves to collide with the sidewalls, the beading structures ridged inward at the sidewalls of the first frame and the second frame may buffer the shock caused by the collision, thereby effectively preventing the battery module from being damaged.

Further, according to an embodiment of the present disclosure, since the thermal conductive material is filled in the battery pack, the heat accumulated in the battery pack may be absorbed and transferred to the pack housing, thereby improving the cooling efficiency of the battery pack.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
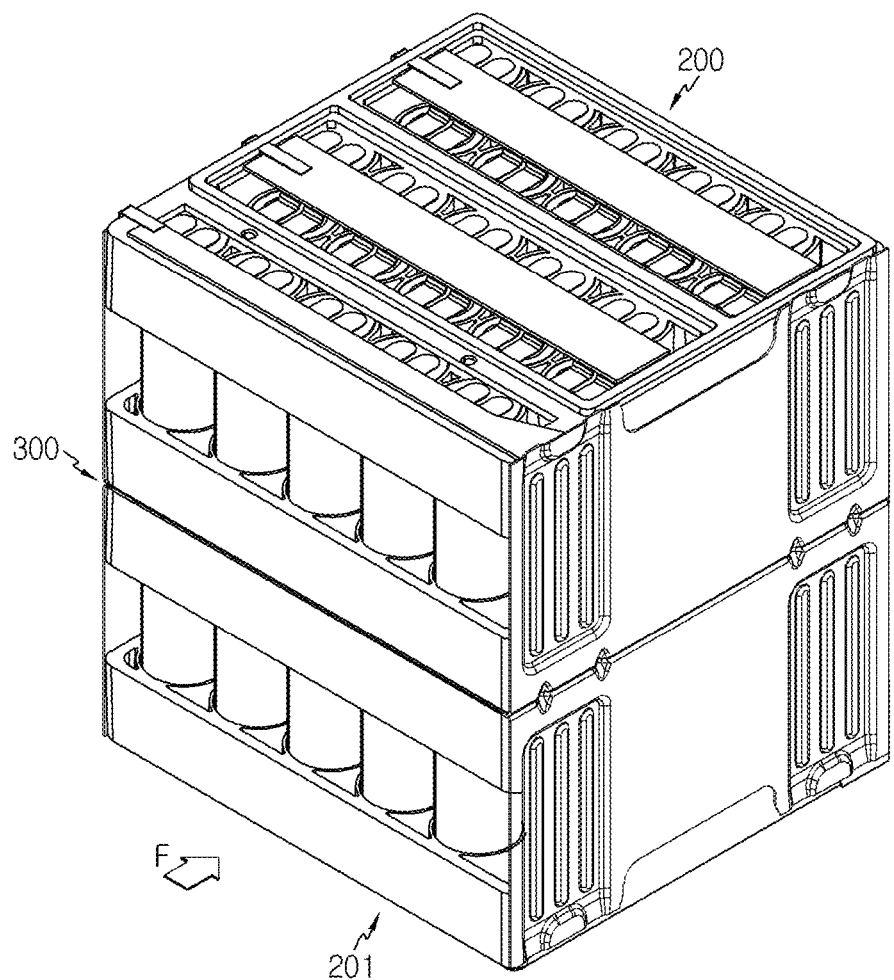
FIG. 1 is a perspective view schematically showing a battery pack according to an embodiment of the present disclosure.

FIG. 1 is a perspective view schematically showing a battery pack according to an embodiment of the present disclosure. Also, FIG. 2 is an exploded perspective view schematically showing components of the battery pack of FIG. 1.

Figure 2:
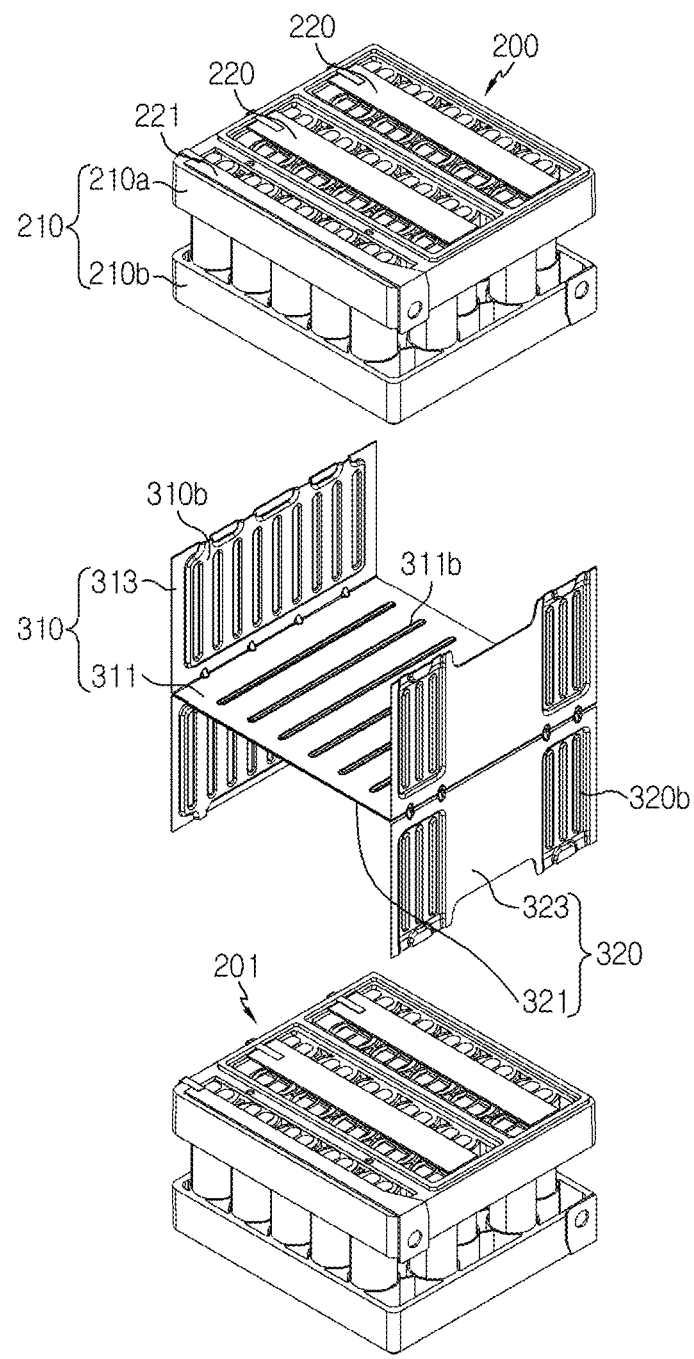
FIG. 2 is an exploded perspective view schematically showing components of the battery pack of FIG. 1.

FIGS. 1 and 2, a battery pack 1000 according to an embodiment of the present disclosure may include a mounting structure 300 and two or more battery modules 200, 201.

Here, the mounting structure 300 may include a first frame 310 and a second frame 320 coupled to a lower portion of the first frame 310. In addition, the first frame 310 may include a body portion 311 and sidewalls 313. Specifically, the body portion 311 may have a plate of a lying-down form such that two surfaces thereof face upward and downward. Further, when looking in an F direction, the sidewalls 313 may be formed by bending both left and right ends of the body portion 311 to extend upward so that an inner space is formed above the plate.

Here, the terms indicating directions such as front, rear, left, right, upper and lower, used in this specification, may vary depending on the position of an observer or the shape of an object. However, in this specification, for convenience of description, the front, rear, left, right, upper and lower directions are distinguished based on the case where viewed in the F direction.

In addition, the second frame 320 may include a body portion 321 and sidewalls 323. Specifically, the body portion 321 may have a plate of a lying-down form such that two surfaces thereof face upward and downward. Further, when looking in the F direction, the sidewalls 323 may be formed by bending both left and right ends of the body portion 321 to extend downward so that an inner space is formed below the plate.

For example, as shown in FIG. 2, the battery pack 1000 may include a first frame 310 and a second frame 320. In addition, the first frame 310 may include a body portion 311 having a plate of a lying-down form and sidewalls 313 bent and extended from both left and right ends of the body portion 311. Further, the second frame 320 include a body portion 321 having a plate of a lying-down form and sidewalls 313 bent and extended from both left and right ends of the body portion 321.

Also, as shown in FIG. 2, a bottom surface of the plate of the body portion 311 of the first frame 310 and a top surface of the body portion 321 plate of the second frame 320 may be coupled to each other. In this case, the first frame 310 and the second frame 320 may be coupled to each other by welding. In addition, each of the first frame 310 and the second frame 320 may have an inner space for accommodating one battery module 200.

Thus, according to this configuration of the present disclosure, since the battery pack 1000 of the present disclosure includes the mounting structure 300 including the first frame 310 and the second frame 320 that respectively form an inner space to accommodate the battery module 200, it is possible to prevent the mounted battery module 200 from being damaged, disabled, life-shortened, fired, or the like due to an external impact. Further, since the mounting structure 300 is constructed by coupling the first frame 310 and the second frame 320, prepared separately, with each other, unlike an integrally formed 'H' structure, the mounting structure 300 may be simply manufactured just with a small manufacturing facility, thereby greatly reducing the manufacturing cost reduced.

Figure 3:
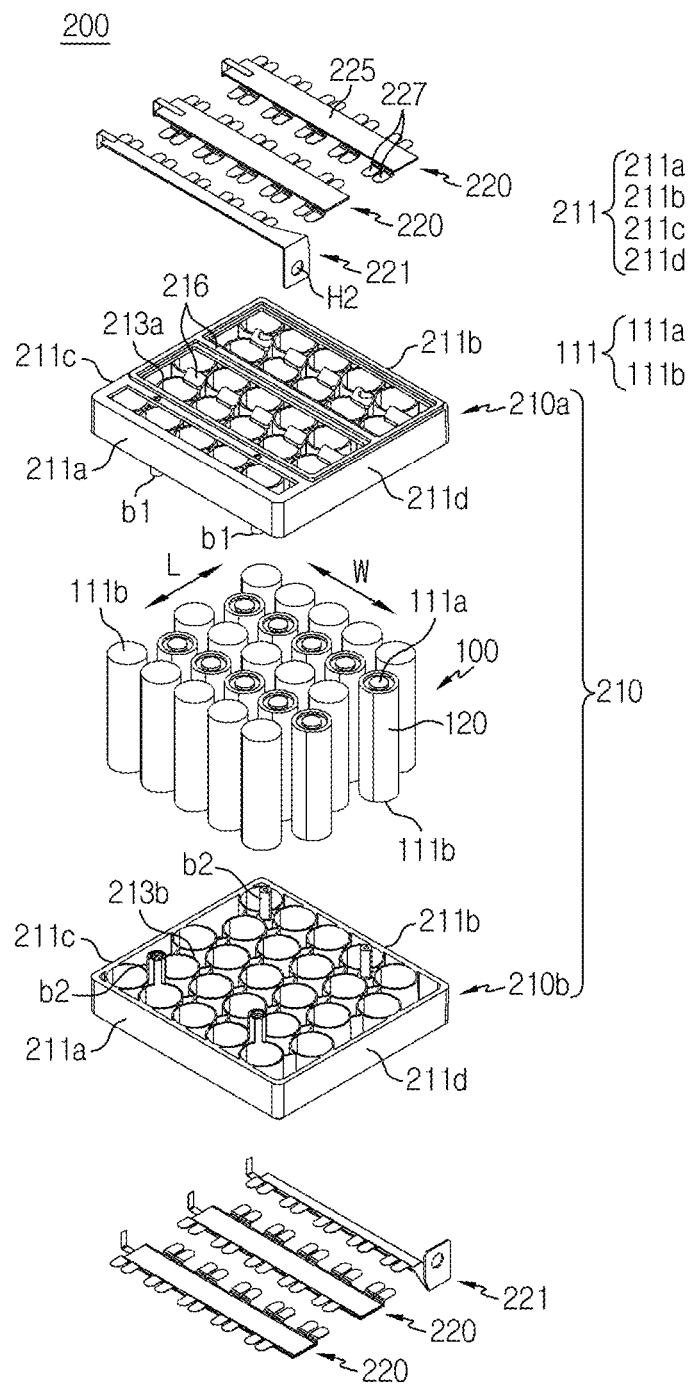
FIG. 3 is an exploded perspective view schematically showing a battery module, employed at the battery pack according to an embodiment of the present disclosure.

FIG. 3 is an exploded perspective view schematically showing a battery module, employed at the battery pack according to an embodiment of the present disclosure.

Referring to FIG. 3, the battery module 200 may include a plurality of cylindrical battery cells 100, a module case 210 configured to insert and accommodate at least a portion of the plurality of cylindrical battery cells 100 therein, and connection plates 220, 221.

Specifically, the cylindrical battery cell 100 may include a cylindrical battery can 120 and an electrode assembly (not shown) accommodated in the battery can 120. Here, the electrode assembly may include a positive electrode and a negative electrode respectively coated with an electrode active material, and a separator interposed between the positive electrode and the negative electrode.

In addition, the cylindrical battery cell 100 may be configured such that the battery can 120 stands up in an upper and lower direction. In addition, the battery can 120 includes a material having high electrical conductivity, and for example, the battery can 120 may include aluminum or copper.

Also, electrode terminals 111 may be formed at upper and lower portions of the battery can 120, respectively. Specifically, a first electrode terminal 111a may be formed on a flat circular upper surface at a top end of the battery can 120, and a second electrode terminal 111b may be formed on a flat circular lower surface at a bottom end of the battery can 120.

For example, as shown in FIG. 3, one cylindrical battery module 200 may include 25 cylindrical battery cells 100. In addition, among the 25 cylindrical battery cells 100, 10 cylindrical battery cells 100 may have a positive electrode terminal 111a formed at a top end thereof and a negative electrode terminal 111b formed at a bottom end thereof. The remaining 15 cylindrical battery cells 100 may have a negative electrode terminal 111b formed at a top end thereof and a positive electrode terminal 111a formed at a bottom end thereof.

In addition, an electrical insulation member may be coated on a side of the battery can 120. That is, since the battery can 120 is electrically connected to an electrode of the electrode assembly therein, an insulating film (not shown) or an electrically insulating adhesive surrounding the side of the battery can 120 may be coated to prevent that an unintended conductive object contacts the battery can 120 to cause electric leakage. In addition, the electrode assembly (not shown) may be wound in a jelly-roll type with a separator being interposed between a positive electrode and a negative electrode. Moreover, a positive electrode tab may be attached to the positive electrode (not shown) and connected to the first electrode terminal 111a at the top end of the battery can 120. Also, a negative electrode tab may be attached to the negative electrode (not shown) and connected to the second electrode terminal 111b at the bottom end of the battery can 120.

Further, when viewed in an F direction, the plurality of cylindrical battery cells 100 may be arranged in a horizontal direction in a standing-up form in the upper and lower direction inside the module case 210. In addition, the plurality of cylindrical battery cells 100 may be arranged in a plurality of columns and rows. Here, when looking in the F direction of FIG. 1, the plurality of cylindrical battery cells provided in one column may be arranged in a front and rear direction L, and the plurality of cylindrical battery cells provided in one row may be arranged in a left and right direction W.

In addition, the plurality of cylindrical battery cells 100 may be arranged in a zigzag form along with cylindrical battery cells 100 located in another adjacent row. More specifically, among the plurality of cylindrical battery cells 100, cylindrical battery cells 100 located in one row and column may be spaced apart from cylindrical battery cells 100 located in another adjacent row in the left and right direction.

For example, as shown in FIG. 3, one battery module 200 includes 23 cylindrical battery cells 100. The 23 cylindrical battery cells 100 may be arranged to be adjacent to each other in the horizontal direction in a standing-up form in the upper and lower direction. Further, the plurality of cylindrical battery cells 100 arranged in one row may have a positive electrode terminal 111a formed at a top end thereof and a negative electrode terminal 111b formed at a bottom end thereof. In addition, the plurality of cylindrical battery cells 100 provided in another row may have the positive electrode terminal 111a at the bottom end thereof and the negative electrode terminal 111b at the top end thereof. Further, the plurality of cylindrical battery cells 100 arranged in one column may be arranged in a zigzag form along with cylindrical battery cells 100 located in another adjacent row. That is, the plurality of cylindrical battery cells 100 arranged in one column may be spaced apart from cylindrical battery cells 100 located in another row by a predetermined distance in the row direction with respect to the center of the cylinder.

Meanwhile, the connection plate 220 may include a connection bar 225 and a contact portion 227. Specifically, the connection bar 225 may be located at the upper portion or the lower portion of the plurality of cylindrical battery cells 100. That is, the connection bar 225 may be mounted to the upper portion or the lower portion of the module case 210.

For example, as shown in FIG. 3, three connection plates 220 may be located at the upper portion of the module case 210 of the battery module 200 to contact the electrode terminals 111 of the plurality of cylindrical battery cells 100, respectively. In addition, three connection plates 220 may be located at the lower portion of the module case 210 of the battery module 200 to contact the electrode terminals 111 of the plurality of cylindrical battery cells 100, respectively. Further, each of the six connection plates 220 may have a connection bar 225. In addition, two connection plates 220 among the six connection plates 220 may have an opening H2 formed at one end thereof to serve as an external input/output terminal.

Further, the connection bar 225 may have a plurality of contact portions 227 formed at a portion thereof to electrically contact the electrode terminals 111 of the plurality of cylindrical battery cells 100. In addition, the contact portion 227 of the connection plate 220 may be formed to protrusively extend in a horizontal direction so as to be in electrical contact with the electrode terminals 111 formed at the plurality of cylindrical battery cells 100. Moreover, the protruding end of the contact portion 227 may have a diverged structure that is divided into two sides with respect to the protrusively extending direction of the connection bar 225.

For example, as shown in FIG. 3, five contact portions 227 may be formed at each of the connection bars 225 of the six connection plates 220. In addition, the contact portion 227 may have a diverged structure that is divided into two sides with respect to the protrusively extending direction.

Further, the connection plate 220 may include an electrically conductive material. For example, the electrically conductive material may be a metal alloy having copper, nickel, aluminum, gold, silver, and the like as a main material.

Moreover, the battery pack 1000 may include a bus bar (not shown) for electrically connecting the plurality of battery modules 200, 201 to each other in series or in parallel. Specifically, the bus bar may be electrically connected to the connection plate provided to each of the battery modules 200, 201. For example, the bus bar may include a material such as aluminum or copper.

Figure 4:
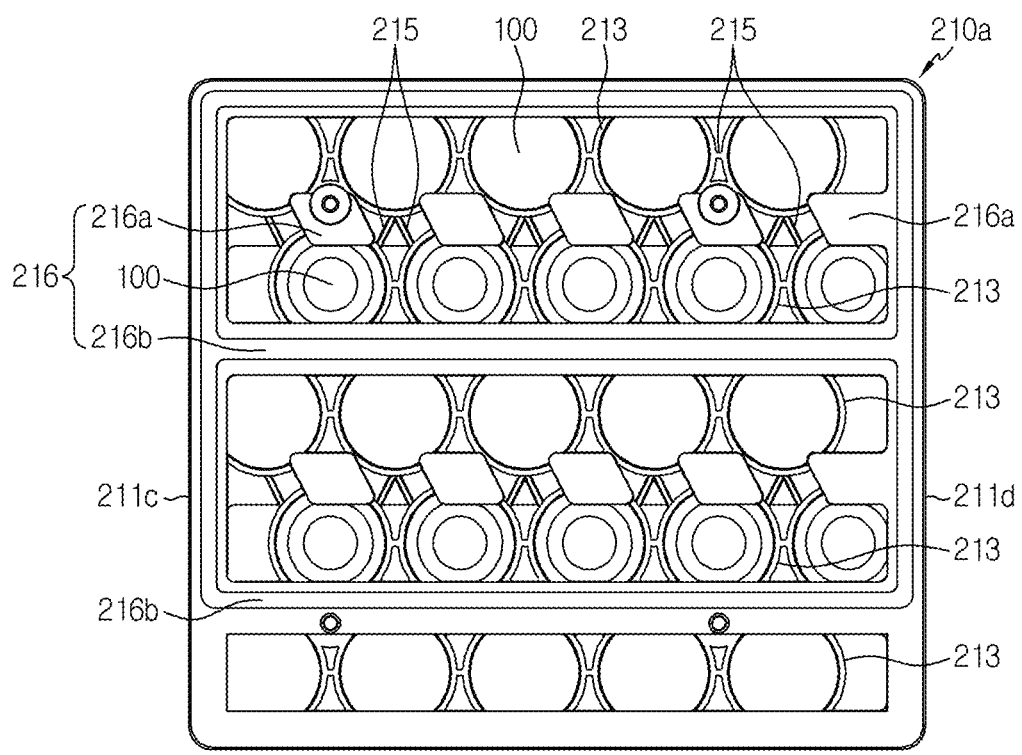
FIG. 4 is a plan view schematically showing the battery module of FIG. 3.
Figure 5:
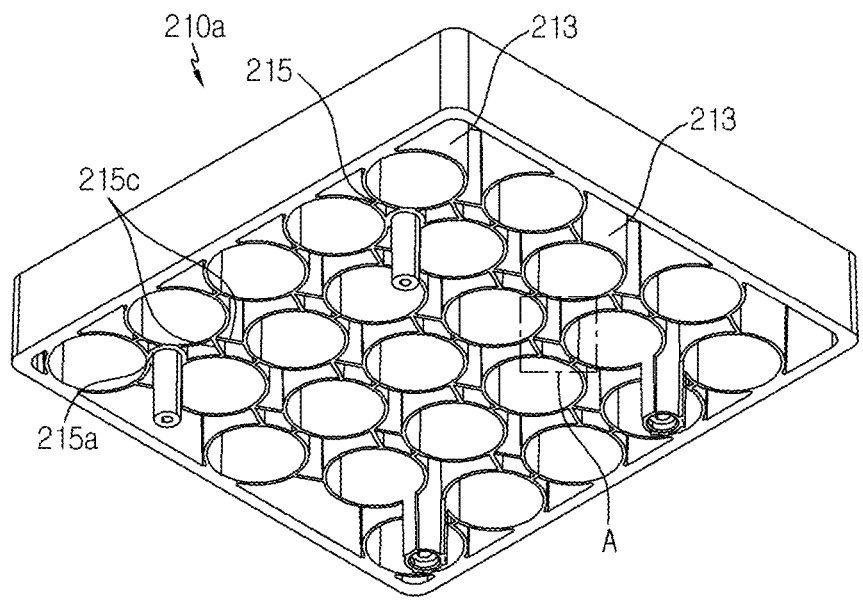
FIG. 5 is a bottom perspective view schematically showing a module case, employed at the battery module of FIG. 3.

FIG. 4 is a plan view schematically showing the battery module of FIG. 3. Also, FIG. 5 is a bottom perspective view schematically showing a module case, employed at the battery module of FIG. 3. Here, the connection plate is not depicted in the battery module 200 of FIG. 4 for sake of convenience of illustration.

Referring to FIGS. 4 and 5 along with FIG. 3, the module case 210 may include a plurality of hollow tubes 213 and a connection portion 215. Specifically, the plurality of hollow tubes 213 may be formed so that at least a portion of the plurality of cylindrical battery cells 100 standing upright in the upper and lower direction is inserted therein. In addition, the hollow tube 213 may be configured to surround the upper surface, the lower surface, or both the upper and lower surfaces of the battery can 120 of the cylindrical battery cell 100 in the horizontal direction.

For example, as shown in FIG. 5, 25 hollow tubes 213 may be formed at the module case 210. In addition, the 25 hollow tubes 213 may be configured to surround the upper horizontal surface of the battery can 120 of the cylindrical battery cell 100. Moreover, the connection portion 215 may be configured to connect the plurality of hollow tubes 213 to each other. For example, the module case 210 may have a plurality of connection portions 215 configured to connect the 25 hollow tubes 213 to each other.

In addition, if the plurality of cylindrical battery cells 100 are arranged in a zigzag form along with cylindrical battery cells 100 located in another adjacent row, the connection portion 215 may be configured to connect one hollow tube 213 and another hollow tube 213 located in another row.

For example, the connection portion 215 may extend in a diagonal direction from one hollow tube 213 to another hollow tube 213 located in another row. Here, the diagonal direction refers to a direction other than the vertical direction, for example a direction inclined by an angle of at least one degree in the left and right direction W (FIG. 3) based on the front and rear direction L (FIG. 3).

In addition, the connection portion 215 may be located on a line connecting a center point of the hollow tube 213 and a center point of another hollow tube 213. Further, the connection portion 215 may be configured to connect to one hollow tube 213 and an adjacent hollow tube 213 located in the same row.

For example, as shown in FIG. 5, the connection portion 215c of the module case 210 may be formed to extend in a left diagonal direction or a right diagonal direction to connect one hollow tube 213 and another hollow tube 213 located in another row. In addition, another connection portion 215 may be formed to extend in the left and right direction W to connect one hollow tube 213 and an adjacent hollow tube 213 located in the same row.

Here, if the plurality of cylindrical battery cells 100 are arranged in a zigzag form along with cylindrical battery cells 100 located in another adjacent row, when an external impact is applied in the front and rear direction L to the battery module 200, a force for moving the plurality of cylindrical battery cells 100 in the diagonal direction may be generated. Accordingly, since the connection portion 215c connecting the plurality of hollow tubes 213 of the module case 210 is configured to extend in the diagonal direction, it may be easy to block or absorb the force for moving the plurality of cylindrical battery cells 100 in the diagonal direction.

Thus, according to this configuration of the present disclosure, since the connection portion 215c is configured to extend in a diagonal direction to connect one hollow tube 213 and another hollow tube 213 located in another row, when an external impact is applied to the battery module 200, the impact force is concentrated on the connection portion 215 so that the connection portion 215 is deformed or ruptured first, thereby minimizing the transmission of impact to the plurality of cylindrical battery cells 100 accommodated in the module case 210.

In addition, the connection portion 215 may have a plate shape. Specifically, the plate shape may be configured such that one end is connected to one hollow tube 213 and the other end is connected to another hollow tube 213. Further, one end and the other end of the connection portion 215 may extend from the bottom end to the top end of the hollow tube 213. That is, the connection portion 215 may have a vertical length corresponding to the vertical length of the hollow tube 213.

Figure 6:
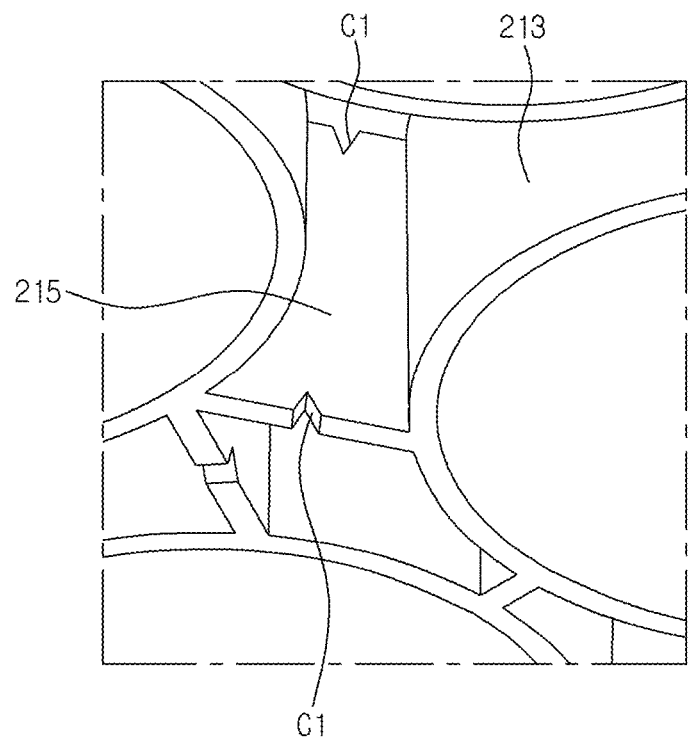
FIG. 6 is a partially enlarged bottom perspective view schematically showing a region A of the module case of FIG. 5.

FIG. 6 is a partially enlarged bottom perspective view schematically showing a region A of the module case of FIG. 5.

Referring to FIG. 6 along with FIG. 1, a vulnerable part Cl may be formed at a portion of the connection portion 215 so as to be raptured or deformed due to an external impact of the battery module 200. For example, the vulnerable part may be a notch partly split in an inner direction. For example, as shown in FIG. 6, a notch may be formed at each of one end (the top end) and the other end (the bottom end) of the connection portion 215. Of course, the vulnerable part is not limited to the notch, and any form may be applied as long as the structure is advantageous for shock absorption. Here, the 'inner direction' refers to a direction toward the center of the body of the connection portion.

Thus, according to this configuration of the present disclosure, since the vulnerable part is formed at the connection portion 215, the force of an external impact applied to the battery module 200 is not concentrated on the cylindrical battery cells 100 but the module case 210 is destroyed first to absorb the impact force, thereby preventing the battery cells from being damaged, life-shortened, ignited, or the like due to the external impact.

Referring to FIG. 3 again, the module case 210 may include an upper case 210a and a lower case 210b. Specifically, the upper case 210a may have a plurality of upper hollow tubes 213a to accommodate the upper portion of the plurality of standing cylindrical battery cells 100. In addition, the lower case 210b may be spaced apart from the upper case 210a in the lower direction by a predetermined distance. Also, the lower case 210b may have a plurality of lower hollow tithes 213b to accommodate the lower portion of the plurality of standing cylindrical battery cells 100. Stoppers 216 are also disposed at the upper case 210a.

That is, the module case 210 including the upper case 210a and the lower case 210b may be located to surround the upper surface and the lower surface of the plurality of cylindrical battery cells 100, respectively. In other words, the module case 210 may be formed such that a central portion of the outer horizontal surface of the plurality of cylindrical battery cells 100 is exposed to the outside.

For example, as shown in FIG. 1, the module case 210 provided to the battery module 200 may include the upper case 210a and the lower case 210b. In addition, the upper hollow tube 213a of the upper case 210a and the lower hollow tube 213b of the lower case 210b may be spaced apart from each other by a predetermined distance.

Thus, according to this configuration of the present disclosure, in the module case 210, since the hollow tubes are not formed to surround the entire outer surface of the plurality of cylindrical battery cells 100 but the upper hollow tube 213a and the lower hollow tube 213b of the upper case 210a and the lower case 210b are provided to respectively surround only the upper surface and the lower surface of the plurality of cylindrical battery cells 100, the heat generated from the plurality of cylindrical battery cells 100 may be effectively dissipated to the outside.

Moreover, referring to FIG. 3 again, some of the plurality of connection portions 215 formed at the module case 210 may have a circular tube b1. Specifically, the upper case 210a may include a plurality of upper connection portions 215 extending to connect the plurality of upper hollow tubes 213 to each other. In addition, some of the plurality of upper connection portions 215 may have a circular tube b1 protrusively extending inward.

Further, the lower case 210b may include a plurality of lower connection portions 215 extended to connect the plurality of lower hollow tubes 213b to each other. In addition, some of the plurality of lower connection portions 215 may have a circular tube b2 protrusively extending inward.

Moreover, the circular tube b1 of the upper connection portion 215 and the circular tube b2 of the lower connection portion 215 may be configured to be coupled to each other. Specifically, the circular tube b1 of the upper connection portion 215 and the circular tube b2 of the lower connection portion 215 may have a male-female coupling structure. In addition, the circular tube b1 of the upper connection portion 215 and the circular tube b2 of the lower connection portion 215 may be coupled to each other by inserting a bolt (not shown) therein. In this case, the bolt may further have a nut coupled to the bolt so as to be inserted into and fixed to the circular tubes b1, b2 of the upper connection portion 215 and the lower connection portion 215.

Figure 7:
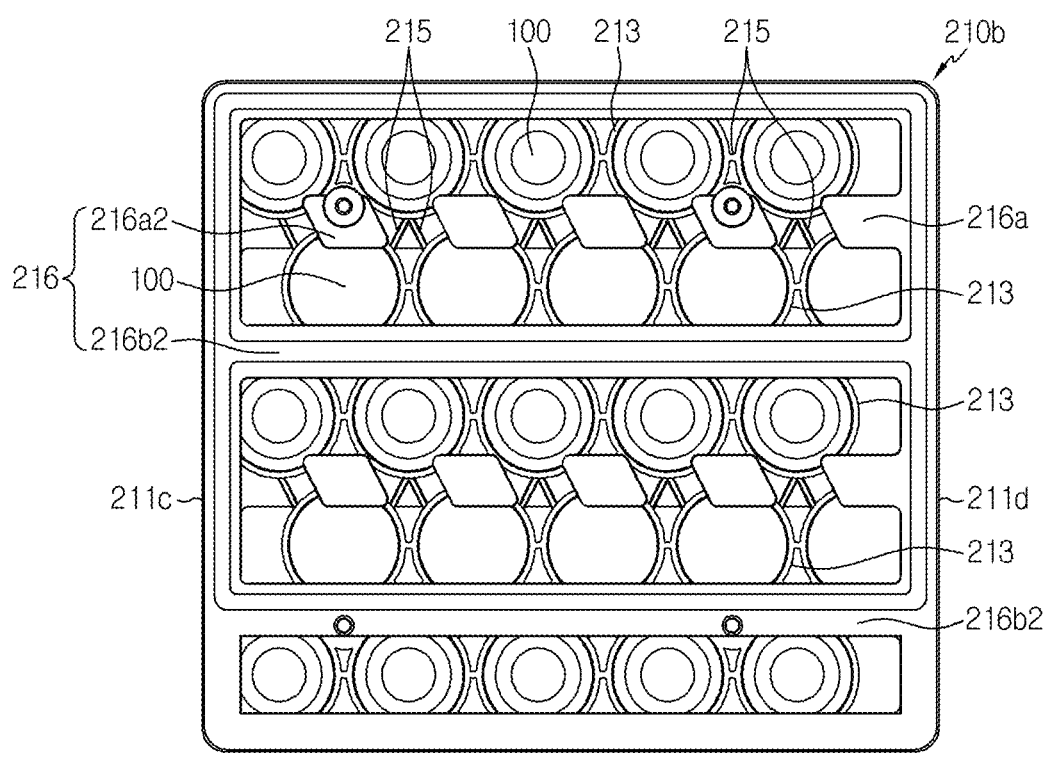
FIG. 7 is a bottom view schematically showing a lower case of the module case of the battery module FIG. 3.

FIG. 7 is a bottom view schematically showing a lower case of the module case of the battery module FIG. 3. Here, the connection plate is not depicted in the battery module 200 of FIG. 7 for sake of convenience of illustration.

First, referring to FIG. 4 again, a plurality of upper stoppers 216a may be formed at the top end of the upper case 210a. In addition, the upper stopper 216a may be configured to block the at least one cylindrical battery cell 100 in a lower direction. That is, the upper stopper 216a may have a plate shape with flat upper and lower surfaces to prevent the plurality of cylindrical battery cells 100 accommodated in the upper case 210a from moving upward. As a result, the cylindrical battery cells 100 may be accommodated and fixed inside the upper case 210a.

Moreover, referring to FIG. 7, a plurality of lower stoppers 216a2 may be formed at the bottom end of the lower case 210b. In addition, the lower stopper 216a2 may be configured to block the at least one cylindrical battery cell 100 in an upper direction. That is, the lower stopper 216a2 may have a plate shape with flat upper and lower surfaces to prevent the plurality of cylindrical battery cells 100 accommodated in the lower case 210b from moving downward. Some lower stopper 216b2 may be shaped to extend from an outer wall of the lower case 210b. As a result, the cylindrical battery cells 100 may be accommodated and fixed inside the lower case 210b.

Thus, according to this configuration of the present disclosure, since the upper stopper 216a and the lower stopper 216a2 are formed at the upper case 210a and the lower case 210b, respectively, it is possible to effectively prevent the plurality of cylindrical battery cells 100 accommodated inside the module case 210 from escaping out of the module case 210 or moving frequently due to an external impact. Accordingly, it is possible to prevent a contact failure or damage between the electrode terminals 111 of the plurality of cylindrical battery cells 100 and the connection plate 220 electrically connected thereto.

Also, referring to FIGS. 3 and 4 again, the hollow tube 213 of the module case 210 may include an upper hollow tube 213a and a lower hollow tube 213b. The module case 210 may include an outer wall 211 formed to surround the plurality of hollow tubes 213 in all directions. Specifically, the outer wall 211 may have a rectangular frame shape that is open in the upper and lower direction. Moreover, the outer wall 211 may be connected to the hollow tubes 213 located at an outer side among the hollow tubes 213 and be located around the plurality of cylindrical battery cells 100 in the horizontal direction.

For example, as shown in FIG. 4, the outer wall 211 of the upper case 210a may be rectangular in a plan view. Further, the outer wall 211 of the upper case 210a may include a first outer wall 211a, a second outer wall 211b, a third outer wall 211c and a fourth outer wall 211d positioned in front, rear, left and right directions. Also, as shown in FIG. 7, the outer wall 211 of the lower case 210b may be rectangular in a plan view.

Further, the outer wall 211 of the lower case 210b may include a first outer wall 211a, a second outer wall 211b, a third outer wall 211c and a fourth outer wall 211d positioned in the front, rear, left and right directions.

Moreover, at least one of the plurality of upper stoppers 216a and lower stoppers 216a2 may extend to connect from the outer wall 211c located at one side to the outer wall 211d located at the other side. For example, as shown in FIG. 4, two 216b of the upper stoppers 216a may be shaped such that one of their left and right ends is connected to the third outer wall 211c and the other end is connected to the fourth outer wall 211d. Also, as shown in FIG. 7, two 216b2 of the lower stoppers 216a2 may be shaped such that one of their left and right ends is connected to the third outer wall 211c and the other end is connected to the fourth outer wall 211d.

Thus, according to this configuration of the present disclosure, since at least one of the plurality of upper stoppers 216a and the lower stoppers 216a2 extends to connect from the outer wall 211 at one side to the outer wall 211 at the other side, the module case 210 may have be advantageously configured to have mechanical stiffness so as to withstand an external impact applied in the left and right direction or in the front and rear direction.

In addition, referring to FIGS. 2 and 3 again, when looking in the F direction of FIG. 1, the outer walls 211 located in the left and right directions of the module case 210 may be positioned to face the sidewall 313 of the first frame 310 or the sidewall 323 of the second frame 320. For example, as shown in FIG. 2, the third outer wall 211c of the module case 210 may be positioned to face the left sidewall 313 with respect to the center of the first frame 310, and the fourth outer wall 211d may be positioned to face the right sidewall 313 of the first frame 310.

Thus, according to this configuration of the present disclosure, if the outer wall 211 located in the extending direction of the upper stopper 216b or the lower stopper 216b2 is positioned to face the sidewall 313 of the first frame 310 or the sidewall 323 of the second frame 320, it is possible to further reinforce mechanical stiffness of the battery pack 1000 to withstand an external impact applied in the left and right direction, thereby improving durability and stability of the battery pack 1000.

Meanwhile, referring to FIG. 2 again, a beading structure 310b may be formed at the first frame 310 and the second frame 320 to increase mechanical rigidity. Specifically, the beading structure 310b may be formed at the sidewalls 313, 323 and the body portions 311, 321 of the first frame 310 and the second frame 320. The beading structure 310b may have a shape ridged inward or outward. Here, the 'inward' may refer to a direction in which the battery module 200 mounted to the first frame 310 or the second frame 320 is located based on the first frame 310 or the second frame 320. Also, the 'outward' may refer to a direction opposite to the inward direction.

For example, as shown in FIG. 2, a beading structure 310b ridged inward may be formed at the sidewalls 313, 323 of the first frame 310 and the second frame 320, respectively. In addition, a plurality of beading structures 311b ridged upward and downward may be formed at the body portions 311, 321 of the first frame 310 and the second frame 320.

Thus, according to this configuration of the present disclosure, since the beading structures 310b, 320b, 311b are formed at the sidewalls 313, 323 and the body portions 311, 321 of the first frame 310 and the second frame 320, the mechanical stiffness of the mounting structure 300 may be directly improved. Further, if the battery module 200 accommodated in the inner space moves to collide with the sidewalls 313, 323, the beading structures 310b, 320b ridged inward at the sidewalls 313, 323 of the first frame 310 and the second frame 320 may buffer the shock caused by the collision, thereby effectively preventing the battery module 200 from being damaged.

Meanwhile, referring to FIG. 1 again, the battery pack 1000 may include several electric components (not shown) electrically connected to the battery modules 200, 201. At this time, a separate module bus bar or cable may be used for the electric connection. Also, the electric components are also referred to as electrical equipment. Further, representative examples of the electrical equipment included in the battery pack 1000 may be a relay, a current sensor, a fuse, a battery management system (BMS), and the like. The electrical equipment refer to components for managing charge and discharge of the cylindrical battery cell 100 included in the battery pack 1000 and ensuring safety and may be regarded as essential components included in most battery packs 1000.

Specifically, the electrical equipment may be provided to outer sides of the sidewalls 313 of the first frame 310 and the sidewall 323 of the second frame 320.

Thus, according to this configuration of the present disclosure, since the electric components are mounted on the outer side of the sidewalls 313, 323 of the first frame 310 and the second frame 320, it is possible to avoid the influence of electromagnetic wave or magnetic field generated from the plurality of battery modules 200 mounted to the mounting structure 300, thereby preventing a malfunction or signal noise. That is, the first frame 310 and the second frame 320 may be made of a metal capable of blocking an electromagnetic wave or magnetic field, thereby exhibiting this effect.

Figure 8:
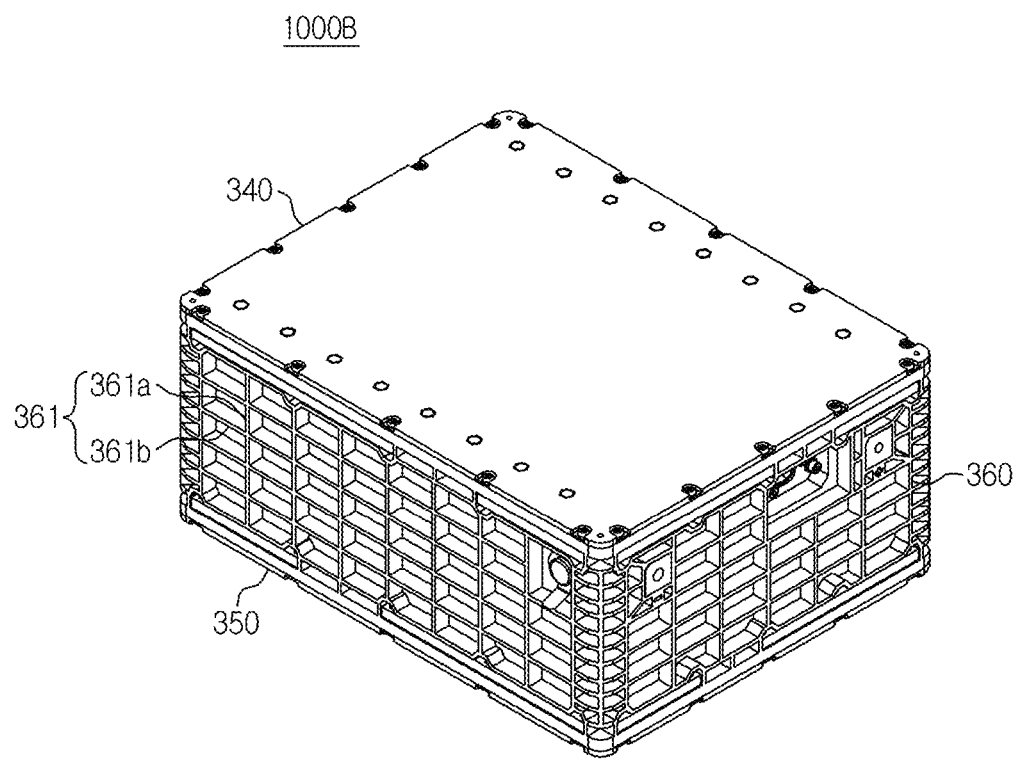
FIG. 8 is a perspective view schematically showing a battery pack according to another embodiment of the present disclosure.
Figure 9:
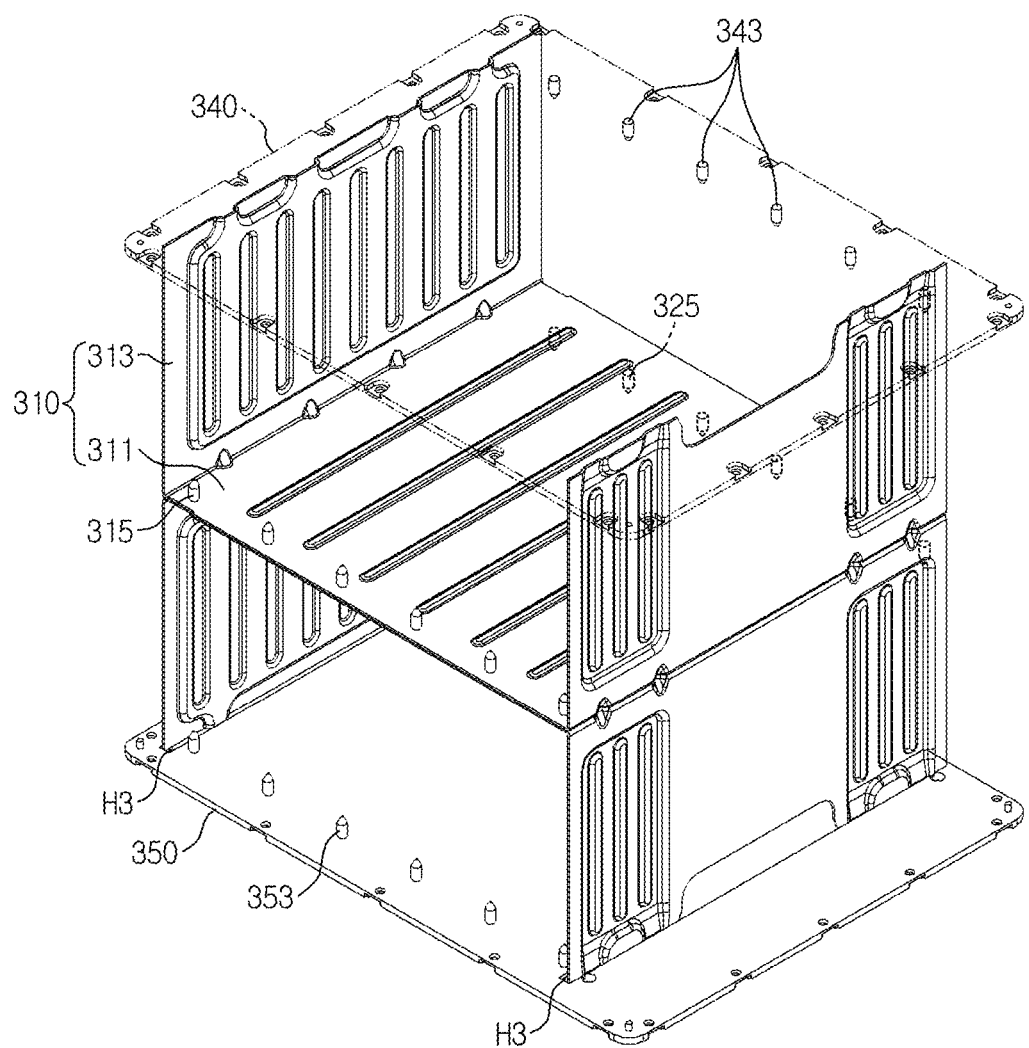
FIG. 9 is a perspective view schematically showing some components of the battery pack of FIG. 8.
Figure 10:
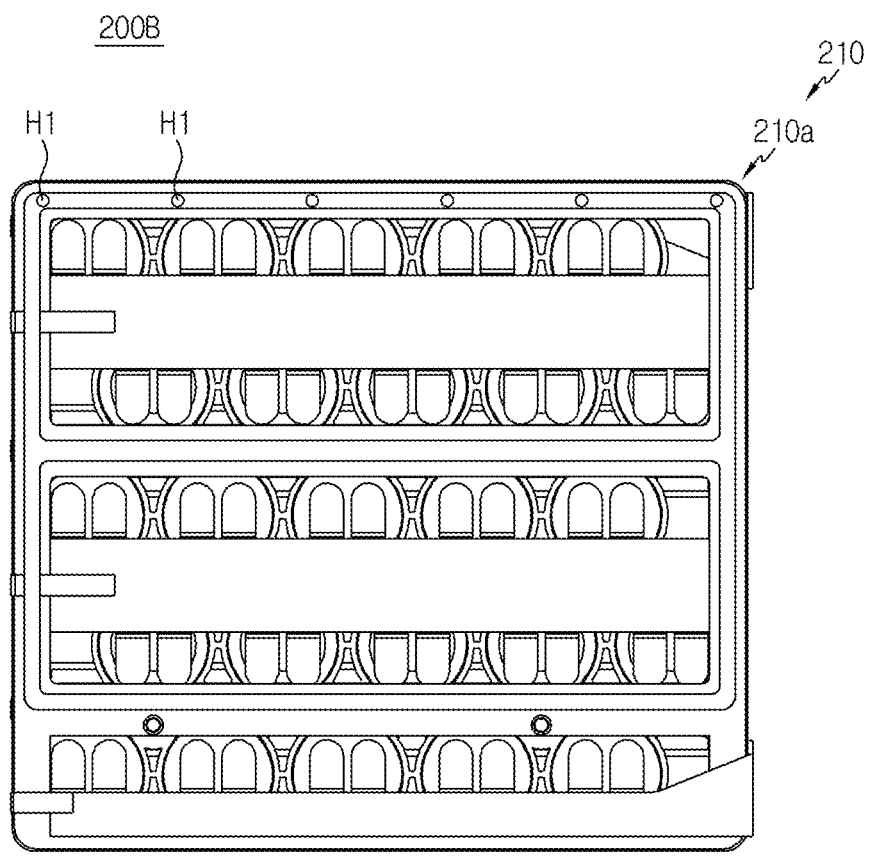
FIG. 10 is a plan view schematically showing a battery module, employed at the battery pack FIG. 8.
Figure 11:
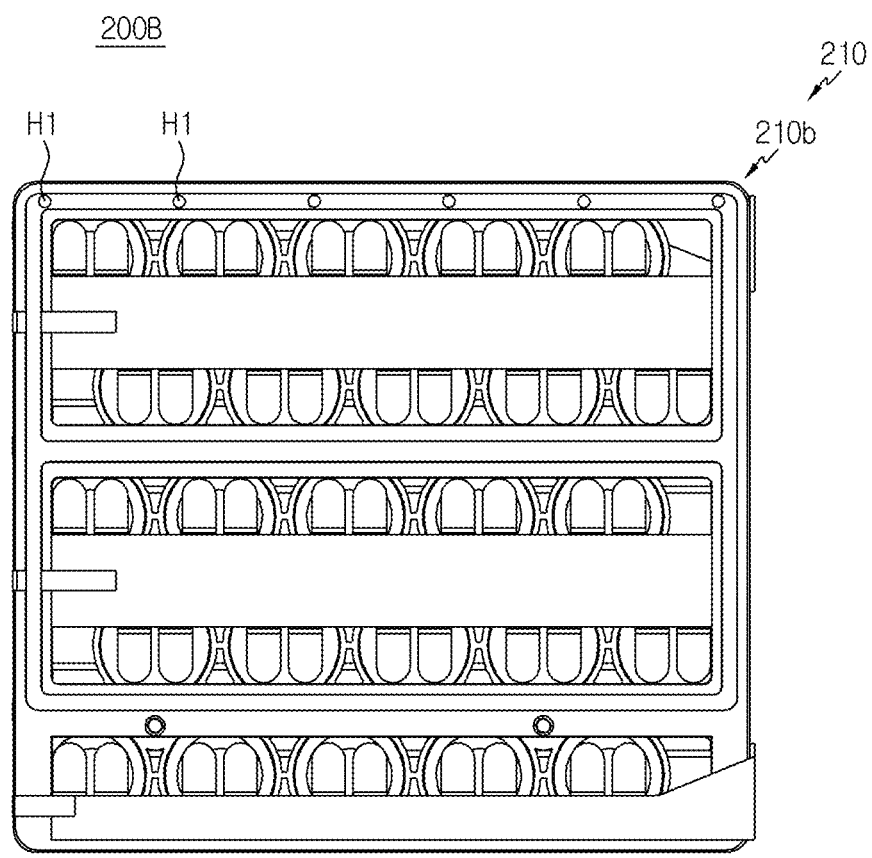
FIG. 11 is a bottom view schematically showing the battery module, employed at the battery pack FIG. 8.

FIG. 8 is a perspective view schematically showing a battery pack according to another embodiment of the present disclosure. FIG. 9 is a perspective view schematically showing some components of the battery pack of FIG. 8. FIG. 10 is a plan view schematically showing a battery module, employed at the battery pack FIG. 8. Also, FIG. 11 is a bottom view schematically showing the battery module, employed at the battery pack FIG. 8. Here, in FIG. 9, the upper plate is depicted transparently, and the insert portion 325 formed at the body portion 311 of the first frame 310 is depicted using a hidden lime for sake of convenience of illustration.

First, referring to FIGS. 10 and 11, a battery module 200B according to another embodiment of the present disclosure may have a fixing groove H1 recessed inward and provided to at least one of a top surface and a bottom surface of the module case 210. Specifically, a plurality of fixing grooves H1 arranged in one direction may be formed at the top surface of the upper case 210a of the module case 210. In addition, a plurality of fixing grooves H1 arranged in one direction may also be formed at the bottom surface of the lower case 210b of the module case 210.

For example, as shown in FIG. 10, a plurality of circular fixing grooves H1 arranged in one direction and recessed downward may be formed at the top surface of the upper case 210a of the module case 210. In addition, for example, as shown in FIG. 11, a plurality of circular fixing grooves H1 arranged in one direction and recessed upward may be formed at the bottom surface of the lower case 210b of the module case 210.

Further, insert portions 315, 325 protrusively extending outward may be formed at the body portion 311 of the first frame 310 and the body portion 321 of the second frame 320 so as to be inserted into the fixing grooves H1. Specifically, a plurality of insert portions 315 protrusively extending upward (a horn shape) may be formed at the top surface of the body portion 311 of the first frame 310. In addition, a plurality of insert portions 325 protrusively extending downward may be formed at the lower surface of the body portion 321 of the second frame 320. Further, the insert portions 315, 325 may be formed to be inserted into the fixing grooves H1 formed at the upper case 210a and the lower case 210b, respectively.

In addition, the insert portion 315 may have a press-fit nut inserted into a fixed opening perforated in the body portion 311 and a horn-shaped bolt coupled to the press-fit nut.

For example, as shown in FIG. 9, six insert portions 315 may be formed at the body portion 311 of the first frame 310.

In addition, the insert portion 315 may include a cylindrical body extending upward from the body portion 311 of the first frame 310 and a top end having a horn shape with a diameter continuously reduced upward. Further, six insert portions 325 may be formed at the body portion 321 of the second frame 320. In addition, the insert portion 325 may include a cylindrical body extending downward from the body portion 321 of the second frame 320 and a top end having a horn shape with a diameter continuously reduced downward.

Thus, according to this configuration of the present disclosure, since the module case 210 has the fixing grooves H1 and the fixing grooves H1 are formed to be inserted into the insert portions 315, 325 of the first frame 310 and the second frame 320, the battery module 200 accommodated in the mounting structure 300 may be fixed without movement.

Referring to FIGS. 8 to 11, a battery pack 1000B according to another embodiment of the present disclosure may further include an upper plate 340, a lower plate 350, and a pack housing 360. Specifically, the upper plate 340 may be formed to have a size to cover the upper portion of the first frame 310. In addition, the upper plate 340 may be positioned to contact the upper portion of the first frame 310. Further, the lower plate 350 may be formed larger than the plane size of the second frame 320 to support the lower portion of the second frame 320 upward. In addition, the lower plate 350 may be located below the second frame 320.

Further, an insert groove (not shown) may be formed at the upper plate 340 so that the top end of the sidewall 313 of the first frame 310 is inserted and fixed therein. In addition, an insert groove H3 may be formed at the lower plate 350 so that the bottom end of the sidewall 323 of the second frame 320 is inserted and fixed therein.

For example, as shown in FIG. 10, the battery pack 1000 may further include a mounting structure 300 having the first frame 310 and the second frame 320, an upper plate 340, and a lower plate 350. Here, the upper plate 340 may be coupled to the top end of the sidewall 313 of the first frame 310. In addition, the lower plate 350 may be coupled to the bottom end of the sidewall 323 (FIG. 2) of the second frame 320.

Thus, according to this configuration of the present disclosure, since the battery pack 1000 further includes the upper plate 340 and the lower plate 350, the plurality of cylindrical battery cells 100 that are an internal configuration may be prevented from being damaged by an impact applied to the upper and lower portions of the battery pack 1000, thereby further enhancing pack stability.

Meanwhile, referring to FIGS. 8 and 9, the pack housing 360 may have a top end coupled to the upper plate 340 and a bottom end coupled to the lower plate 350. In addition, the pack housing 360 may have a cylinder form that is open in the upper and lower direction. Further, a rib 361 of a grid pattern may be formed at the sidewall of the pack housing 360. For example, as shown in FIG. 8, the rib 361 of a grid pattern in which linear ribs 361a extending in the vertical direction and linear ribs 361b extending in the horizontal direction are intersected may be formed at the sidewall of the pack housing 360.

Therefore, according to this configuration of the present disclosure, since the lattice rib 361 is formed at the pack housing 360, the pack housing 360 may be lightened and mechanical stiffness may be compensated, thereby reducing the manufacturing cost of the pack housing 360 and improving the applicability.

In addition, referring to FIGS. 9, 10 and 11 again, fixing portions 353 may be formed at the upper plate 340 and the lower plate 350 so as to be inserted into the fixing grooves H1 formed at the lower case 210b of the module case 210. Specifically, the fixing portion 353 may be formed to protrusively extend inward.

For example, as shown in FIG. 9, the fixing portion 343 formed at the upper plate 340 may include a cylindrical body extending downward from the lower surface of the plate and a bottom end having a horn shape with a diameter continuously reduced downward. Further, the fixing portion 353 formed at the lower plate 350 may include a cylindrical body extending upward from the upper surface of the plate and a top end having a horn shape with a diameter continuously reduced upward.

Thus, according to this configuration of the present disclosure, since each of the upper plate 340 and the lower plate 350 includes the fixing portion 353 configured to be inserted into the fixing groove H1 formed at the module case 210, the battery module 200 mounted to the mounting structure 300 may be firmly fixed without movement.

In addition, the pack housing 360 of the battery pack 1000B may be filled with a thermal conductive material (not shown). Specifically, the thermal conductive material may include a polymer resin with high thermal conductivity, a silicone-based resin or a filler. For example, the polymer resin may be a polysiloxane resin, a polyamide resin, a urethane resin, or an epoxy-based resin. In addition, the thermal conductive material may be in a form in which the added adhesive material is solidified. For example, the adhesive material may be a material such as acryl-based, polyester-based, polyurethane-based or rubber-based materials.

In addition, as shown in FIG. 8, a thermal conductive material may be filled in the pack housing 360 of the battery pack 1000B. Also, the thermal conductive material may be filled to cover the outer surface of the battery module 200 included in the battery pack 1000B.

Therefore, according to this configuration of the present disclosure, since the thermal conductive material is filled in the battery pack 1000B, the heat accumulated in the battery pack 1000B may be absorbed and transferred to the pack housing 360, thereby improving the cooling efficiency of the battery pack 1000B.

Meanwhile, an electronic device according to the present disclosure may include the battery pack 1000. Moreover, the electronic device (not shown) may have a case (not shown) for accommodating the battery pack 1000 therein.

Moreover, a vehicle (not shown) according to the present disclosure may include the battery pack 1000. Further, the vehicle may be an electric vehicle having an electric motor (not shown), for example, powered by the battery pack 1000.

Figure 12:
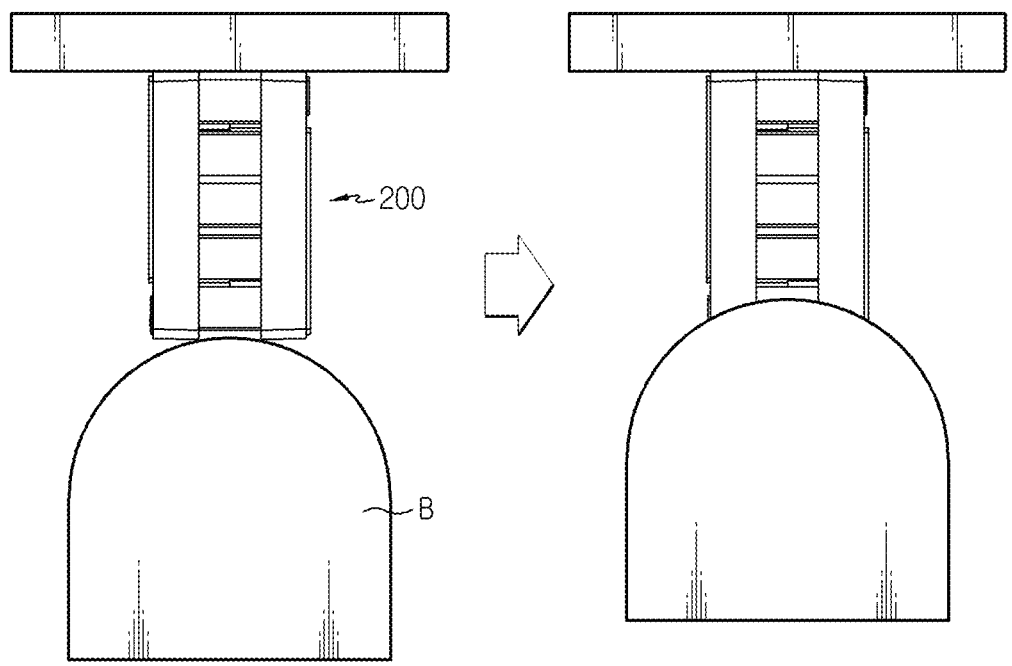
FIG. 12 is a diagram schematically showing a crash test procedure for the battery module according to an embodiment of the present disclosure.
Figure 13:
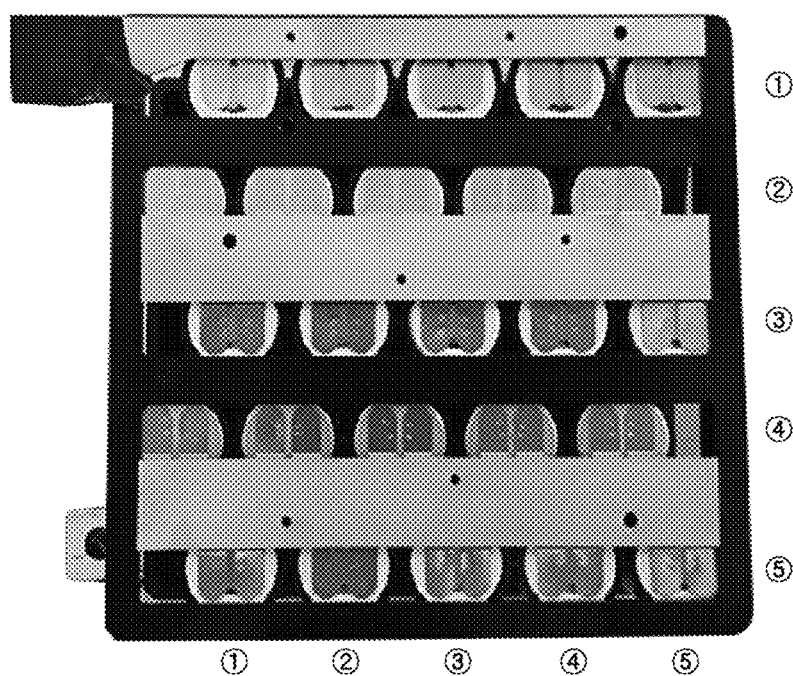
FIG. 13 show photographs showing the battery module according to an embodiment of the present disclosure, taken before and after the crash test.
Figure 13:
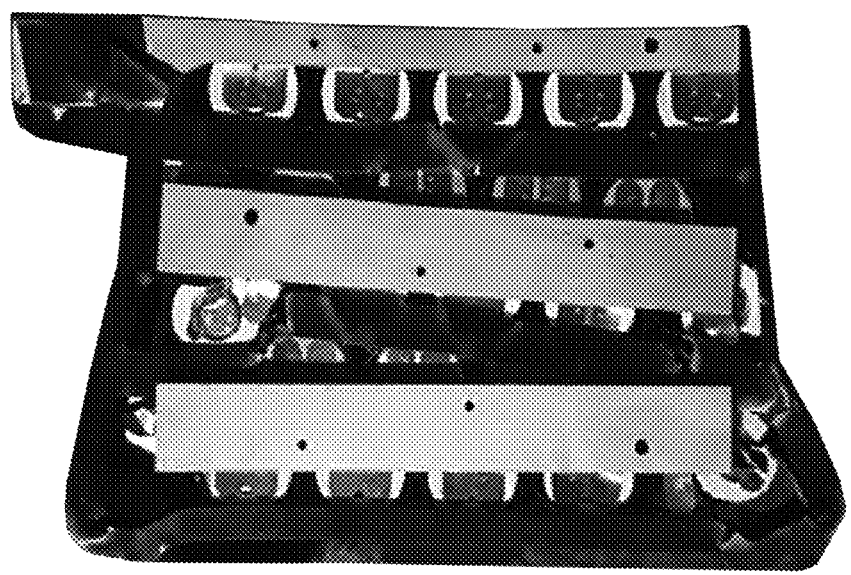

FIG. 12 is a diagram schematically showing a crash test procedure for the battery module according to an embodiment of the present disclosure. Also, FIG. 13 show photographs showing the battery module according to an embodiment of the present disclosure, taken before and after the crash test.

Referring to FIG. 12, the battery module 200 according to an embodiment of the present disclosure has a length of 125 mm in one direction. After one side of the battery module 200 was pressed using a crush bar B to a distance of 37.5 mm at a speed of 100 mm/min, a safety (durability) test was performed to evaluate the state of the 25 mounted cylindrical battery cells.

Specifically, the battery module 200 used in this test has the same configuration as the battery module 200 shown in FIG. 1, which includes 25 cylindrical battery cells arranged in a zigzag form with 5 columns and 5 rows, a connection plate and a module case. Here, the module case 210 is made of LUPOY GN5001RF (product name) produced by LG Chemical, which is an engineering plastic in which polycarbonate and ABS resin are combined.

As a result of the test, after the crush bar (B) collides with the battery module 200, the voltage of each of the 25 cylindrical battery cells arranged in 5 column and 5 rows in the battery pack according to an embodiment of the present disclosure was measured. The voltage values of the cylindrical battery cells corresponding to the arranged order are shown as follows. At this time, the average voltage value of the 25 cylindrical battery cells before the collision was approximately 4.187V.

TABLE 1

| row/column | 1 | 2 | 3 | 4 | 5 |
|---|---|---|---|---|---|
| 1 | 4.184 | 4.187 | 4.187 | 4.187 | 4.187 |
| 2 | 4.157 | 4.157 | 4.157 | 4.157 | 4.157 |
| 3 | 4.180 | 4.180 | 4.180 | 4.180 | 4.180 |
| 4 | 4.187 | 4.187 | 4.185 | 4.187 | 4.187 |
| 5 | 4.187 | 4.187 | 4.187 | 4.187 | 4.187 |

(unit: V, volt)

As understood from the voltage values in Table 1, after the crash test, the 25 cylindrical battery cells accommodated in the battery module of the present disclosure generally maintained their normal voltage values. That is, when the cylindrical battery cells are arranged in a zigzag form along with cylindrical battery cells located in another adjacent row, if an external impact is applied in the front and rear direction to the battery module 200, a force for moving the cylindrical battery cells in the diagonal direction may be generated. Accordingly, since the module case of the battery module of the present disclosure includes the connection portion that connects the hollow tubes in a diagonal direction, it is possible to block the force caused by the impact and moving the cylindrical battery cells in the diagonal direction or absorb the impact force, thereby effectively preventing the cylindrical battery cells from being damaged.

Meanwhile, even though the terms indicating directions such as upper, lower, left, right, front and rear directions are used in the specification, it is obvious to those skilled in the art that these merely represent relative locations for convenience in explanation and may vary based on a location of an observer or an object.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

| Reference Signs | |
|---|---|
| 1000: battery pack | 100: cylindrical battery cell |
| 300: mounting structure | 310, 320: first frame, second frame |
| 311, 321: body portion | 313, 323: sidewall |
| 315, 325: insert portion | |
| 200, 201: battery module | |
| 111, 111a, 111b: electrode terminal, first electrode terminal, second electrode terminal | |
| 220, 221: connection plate | 225, 227: connection bar, contact portion |
| 210: module case | 210a, 210b: upper case, lower case |
| 211, 211a, 211b, 211c, 211d: outer wall, first outer wall, second outer wall, third outer wall, fourth outer wall | |
| H1: fixing groove | 216a, 216b: upper stopper, lower stopper |

| Reference Signs | |
|---|---|
| 213: hollow tube | 215, 215a, 215c: connection portion |
| 310b, 320b: beading structure | 340, 350: upper plate, lower plate |
| 353: fixing portion | 360: pack housing |

INDUSTRIAL APPLICABILITY

The present disclosure relates to a battery pack including a plurality of battery modules. In addition, the present disclosure is available for industries associated with electronic devices or vehicles including the battery pack.

What is claimed is:

1. A battery pack, comprising:
a mounting structure including:
a first frame having a first body portion with a first plate placed horizontally, and first sidewalls bent from opposite ends of the first body portion and extending upward to form an inner space above the first plate, and
a second frame coupled to a lower portion of the first frame and having a second body portion with a second plate placed horizontally, and second sidewalls bent from opposite ends of the second body portion and extending downward to form an inner space below the second plate; and
at least two battery modules respectively accommodated in the inner spaces of the first frame and the second frame, each battery module including:
a plurality of cylindrical battery cells;
a module case having a plurality of hollow tubes into which the plurality of cylindrical battery cells standing upright in an upper and lower direction are inserted; and
a connection portion configured to connect the plurality of hollow tubes to each other,
wherein the connection portion has a plate shape of which one end is connected to one hollow tube and the other end is connected to another hollow tube,
wherein a vulnerable part is formed at the connection portion so as to be ruptured or deformed by an external impact to each battery module, and
wherein the vulnerable part is where a material of the connection portion is missing.

2. The battery pack according to claim 1, wherein the plurality of cylindrical battery cells are arranged in a plurality of columns and rows in the module case,
wherein the plurality of cylindrical battery cells of a row are arranged in a zigzag form along with the plurality of cylindrical battery cells located in another adjacent row, and
wherein the connection portion extends in a diagonal direction to connect the one hollow tube of one row to the another hollow tube located in another row.

3. The battery pack according to claim 1, wherein the module case includes:
an upper case having a plurality of upper hollow tubes among the plurality of hollow tubes, and configured to accommodate an upper portion of the plurality of cylindrical battery cells, and
a lower case spaced apart from the upper case in a lower direction and having a plurality of lower hollow tubes among the plurality of hollow tubes, and configured to accommodate a lower portion of the plurality of cylindrical battery cells.

4. The battery pack according to claim 3, wherein a plurality of upper stoppers configured to block at least one cylindrical battery cell among the plurality of cylindrical battery cells in a downward direction are formed at a top end of the upper case, and
wherein a plurality of lower stoppers configured to block the at least one cylindrical battery cell among the plurality of cylindrical battery cells in an upward direction are formed at a bottom end of the lower case.

5. The battery pack according to claim 4, wherein the module case further includes:
an outer wall opened in the upward and downward directions and connected to hollow tubes located at an outer side of the module case among the plurality of hollow tubes of the module case to surround the plurality of cylindrical battery cells in a horizontal direction, and
at least one of the plurality of upper stoppers and the plurality of lower stoppers extends from one side to the other side of the outer wall.

6. The battery pack according to claim 5, wherein the outer wall provided in the extending direction of the upper stopper or the lower stopper is located to face the first sidewalls or the second sidewalls of the first frame or the second frame.

7. The battery pack according to claim 6, wherein a beading structure ridged inward or outward is formed at each sidewall and body portion of each of the first frame and the second frame.

8. The battery pack according to claim 1, wherein a fixing groove recessed inward is formed in at least one of a top surface and a bottom surface of the module case, and
wherein an insert portion protrusively extending outward is formed on each body portion of each of the first frame and the second frame so as to be inserted into the fixing groove.

9. The battery pack according to claim 8, further comprising:
an upper plate located to cover an upper portion of the first frame;
a lower plate located to support a lower portion of the second frame upward; and
a pack housing having a top end coupled to the upper plate and a bottom end coupled to the lower plate and opened in upward and downward directions,
wherein a fixing portion protrusively extending inward is formed at the upper plate and the lower plate so as to be inserted into the fixing groove of the module case.

10. An electronic device, comprising the battery pack according to claim 1.

11. A vehicle, comprising the battery pack according to claim 1.

12. The battery pack according to claim 1, wherein the first plate and the second plate are the same plate, or are integrated.

13. The battery pack according to claim 1, wherein the vulnerable part includes a notch.

* * * * *